United States Patent
Jung

(10) Patent No.: US 9,847,775 B2
(45) Date of Patent: Dec. 19, 2017

(54) BUFFER, AND MULTIPHASE CLOCK GENERATOR, SEMICONDUCTOR APPARATUS AND SYSTEM USING THE SAME

(71) Applicant: SK hynix Inc., Icheon-si, Gyeonggi-do (KR)

(72) Inventor: Hae Kang Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/279,727

(22) Filed: Sep. 29, 2016

(65) Prior Publication Data

US 2017/0331462 A1    Nov. 16, 2017

(30) Foreign Application Priority Data

May 12, 2016    (KR) ........................ 10-2016-0058251

(51) Int. Cl.
*H03K 3/356* (2006.01)
*H03K 3/3562* (2006.01)
*H03K 5/15* (2006.01)
*H03M 9/00* (2006.01)

(52) U.S. Cl.
CPC ..... *H03K 3/35625* (2013.01); *H03K 5/15013* (2013.01); *H03M 9/00* (2013.01)

(58) Field of Classification Search
None
See application file for complete search history.

(56) References Cited

U.S. PATENT DOCUMENTS

| 7,573,339 | B2 | 8/2009 | Cong |
| 8,836,376 | B2 | 9/2014 | Danjo |
| 2007/0200605 | A1* | 8/2007 | Marsh .............. H03K 3/356043 327/208 |
| 2007/0252619 | A1* | 11/2007 | Bitting ........... H03K 19/018521 326/87 |

* cited by examiner

*Primary Examiner* — Long Nguyen
(74) *Attorney, Agent, or Firm* — William Park & Associates Ltd.

(57) ABSTRACT

A buffer includes an amplification circuit, an amplification current generation circuit, and a latch. The amplification circuit may change voltage levels of a first output node and a second output node based on a clock signal and a pair of input signals. The amplification current generation circuit may provide currents having different magnitudes to the first and second output nodes during a first operation period, and may provide currents having the same magnitude to the first and second output nodes during a second operation period. The latch circuit may latch the voltage levels of the first output node and the second output node based on the clock signal.

20 Claims, 6 Drawing Sheets

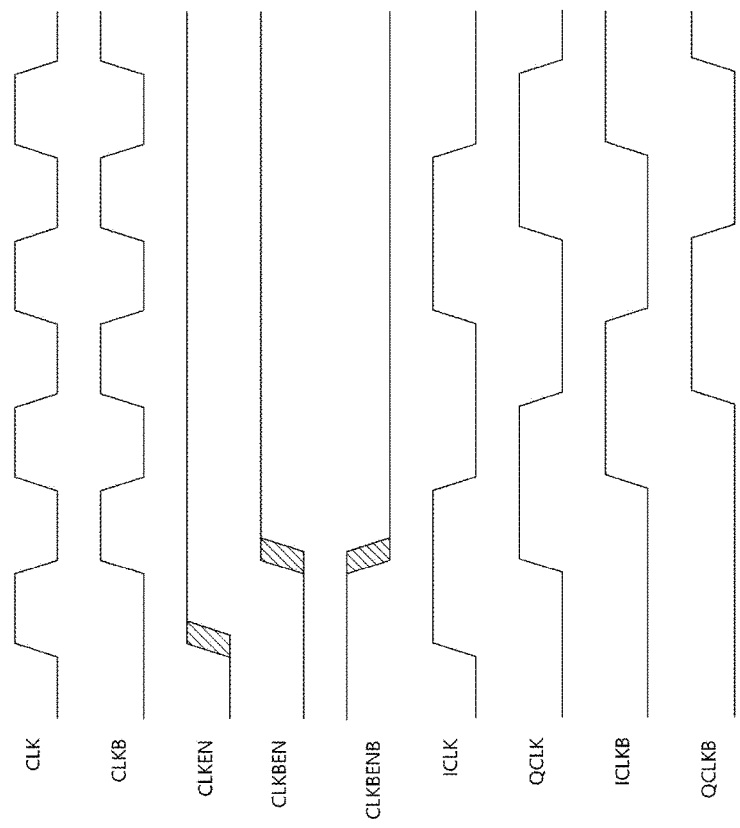

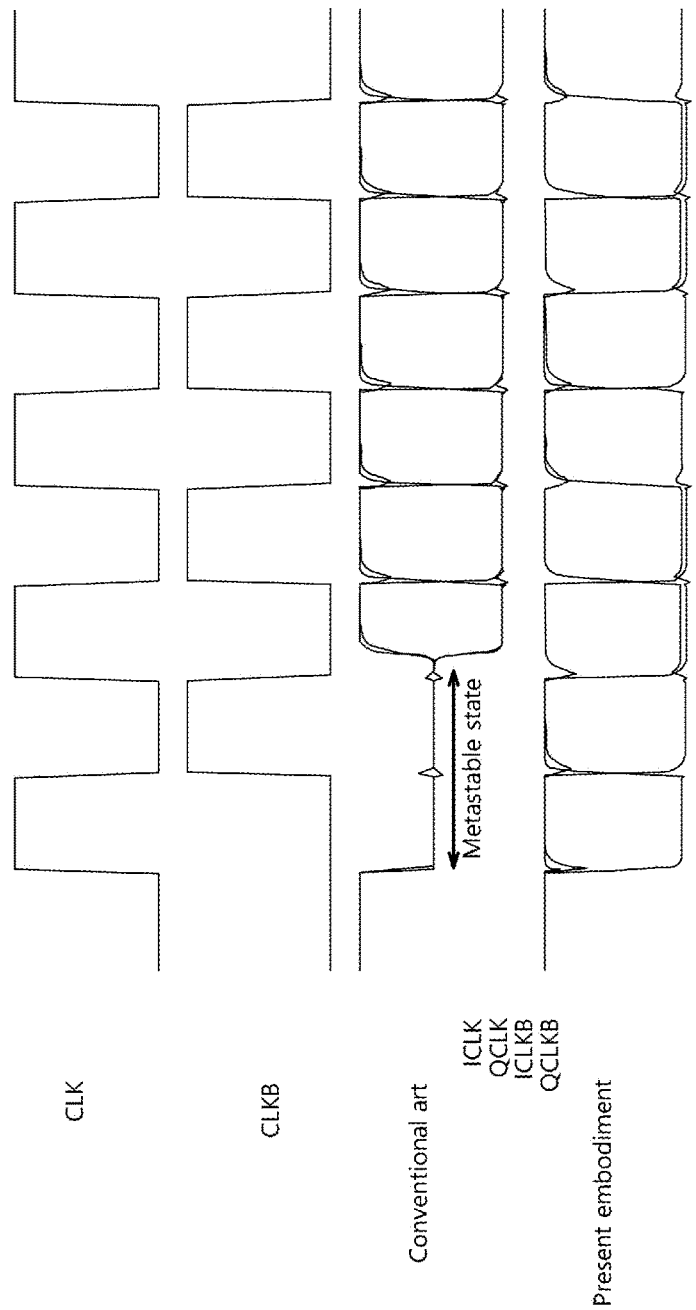

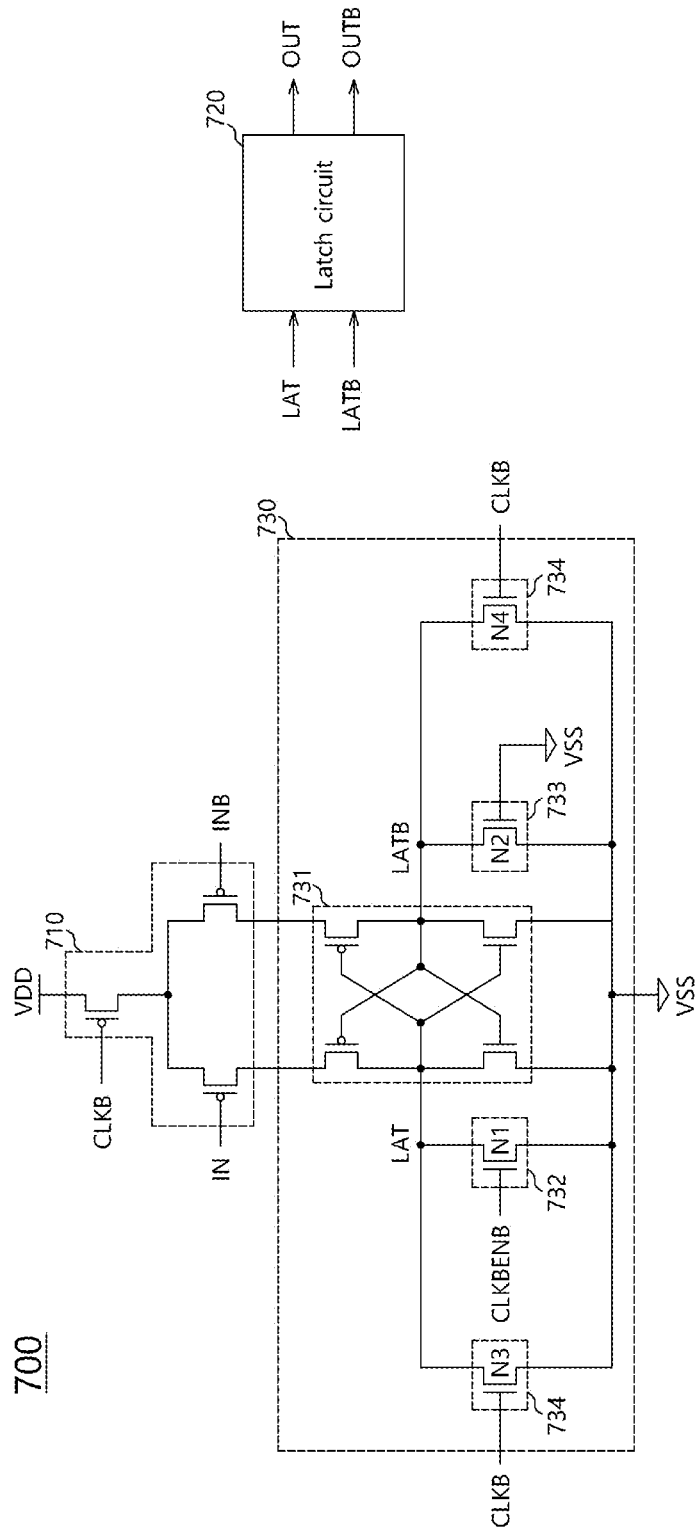

BUFFER, AND MULTIPHASE CLOCK GENERATOR, SEMICONDUCTOR APPARATUS AND SYSTEM USING THE SAME

CROSS-REFERENCES TO RELATED APPLICATION

The present application claims priority under 35 U.S.C. §119(a) to Korean application number 10-2016-0058251 filed on May 12, 2016, in the Korean Intellectual Property Office, which is incorporated herein by reference in its entirety.

BACKGROUND

1. Technical Field

Various embodiments generally relate to a semiconductor technology, and, more particularly, to a buffer, and a multiphase clock generator, a semiconductor apparatus and a system using the same.

2. Related Art

Electronic systems may consist of a large number of electronic components. Among the electronic systems, a computer system may consist of many semiconductor apparatuses, which are electronic components that exploit the electronic properties of semiconductor materials. Within a computer system, a communication is usually synchronous, and thus the semiconductor apparatuses may transmit/receive data signals in synchronization with clock signals. Data between computer systems is usually transmitted via a serial communication interface. However, the data may be transmitted simultaneously on different channels in the semiconductor apparatuses to increase its transmission bit rate. As a result, it is necessary to make a serial-to-parallel conversion at an interface between a semiconductor apparatus and an external device when the semiconductor apparatus receives data from the external device. Likewise, it is necessary to make a parallel-to-serial conversion when sending data from the semiconductor apparatus to the external device.

The semiconductor apparatus may use a clock signal to align the data signals transmitted through a serial bus. However, a high-speed system uses high-frequency clock signals, and thus the data signals aligned using the high-frequency clock signals may be less reliable. Accordingly, the semiconductor apparatus may include a clock generator that is able to divide the frequency of a clock signal and generate multiphase clock signals. Using the frequency-divided clock signals may provide better precision in capturing data signals.

SUMMARY

In an embodiment, a buffer may include an amplification circuit, an amplification current generation circuit, and a latch circuit. The amplification circuit may change voltage levels of a first output node and a second output node based on a clock signal and a pair of input signals. The amplification current generation circuit may provide currents of different magnitudes to the first and second output nodes during a first operation period, and may provide currents of the same magnitude to the first and second output nodes during a second operation period. The latch circuit may latch the voltage levels of the first output node and the second output node based on the clock signal.

In an embodiment, a buffer may include a first amplification circuit, first though sixth load resistors, a first offset switch, and a second amplification circuit. The first amplification circuit may change voltage levels of a first output node and a second output node based on a clock signal and a pair of input signals. The first load resistor, the second load resistor and the third load resistor may be coupled in series between a power supply voltage and the first output node. The fourth load resistor, the fifth load resistor and the sixth load resistor may be coupled in series between the power supply voltage and the second output node. The first offset switch may provide the power supply voltage to a node between the fifth load resistor and the sixth load resistor based on the clock signal. The second amplification circuit may store the voltage levels of the first output node and the second output node based on the clock signal.

In an embodiment, a buffer may include an amplification circuit, an amplification current generation circuit, and a latch circuit. The amplification circuit may change voltage levels of a first output node and a second output node based on a clock signal and a pair of input signals. When the clock signal is not input, the amplification current generation circuit may change the first and second output nodes to different voltage levels regardless of the pair of input signals. The latch circuit may latch the voltage levels of the first output node and the second output node based on the clock signal, and may generate a pair of output signals.

In an embodiment, a buffer may include an amplification circuit, an amplification current generation circuit, and a latch circuit. The amplification circuit may change voltage levels of a first output node and a second output node based on a clock signal and a pair of input signals. When a clock signal is not input, the amplification current generation circuit may change the first and second output nodes to different voltage levels regardless of the pair of input signals. The latch circuit may latch the voltage levels of the first output node and the second output node based on the clock signal, and may generate a pair of output signals.

BRIEF DESCRIPTION OF THE DRAWINGS

FIG. 5 is a timing diagram illustrating example waveforms of the buffer and the multiphase clock generator of FIG. 3 in accordance with an embodiment.

FIG. 6 is a timing diagram illustrating example waveforms of the multiphase clock generator in accordance with an embodiment and waveforms of the conventional art.

FIG. 7 is a diagram illustrating an example of a buffer in accordance with an embodiment.

DETAILED DESCRIPTION

Hereinafter, a buffer, and a multiphase clock generator, a semiconductor apparatus and a system using the same will be described below with reference to the accompanying drawings through various examples of embodiments.

Figure 1:
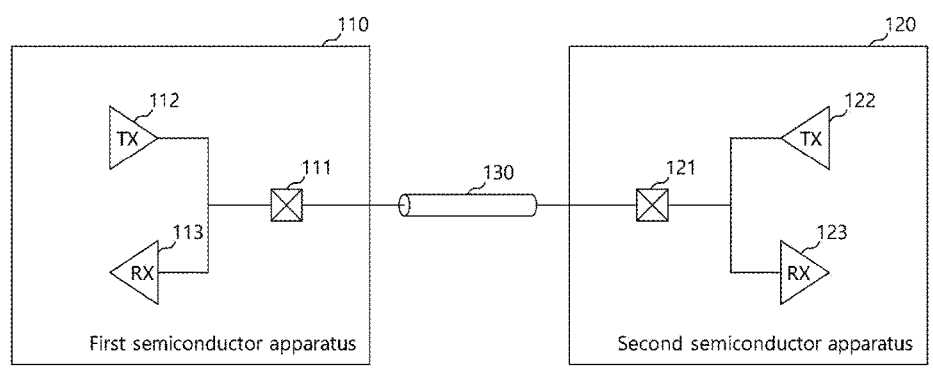
FIG. 1 is a diagram illustrating an example of a system in accordance with an embodiment.

Embodiments may provide a buffer capable of generating output signals regardless of input signals to substantially prevent a metastable state from occurring at an initial operation stage, and a multiphase clock generator, a semiconductor apparatus and a system using the same. FIG. 1 is a diagram illustrating an example of a system in accordance with an embodiment. In FIG. 1, a system 1 in accordance with an embodiment may include a first semiconductor apparatus 110 and a second semiconductor apparatus 120. The first semiconductor apparatus 110 and the second semiconductor apparatus 120 may be electronic components that communicate with each other. In an embodiment, the first semiconductor apparatus 110 may be a master device, and the second semiconductor apparatus 120 may be a slave device that is operated by the first semiconductor apparatus 110. For example, the first semiconductor apparatus 110 may be a processor such as a central processing unit (CPU), a graphic processing unit (GPU), a multimedia processor (MMP), and a digital signal processor (DSP). Also, the first semiconductor apparatus 110 may be realized in the form of a system-on-chip (SOC) by combining a plurality of processor chips having various functions such as application processors. The second semiconductor apparatus 120 may be a memory, and examples of the memory may include a volatile memory or a nonvolatile memory. Examples of the volatile memory may include an Static Random Access Memory (SRAM), a Dynamic RAM (DRAM), and a synchronous DRAM (SDRAM), and examples of the nonvolatile memory may include a Read Only Memory (ROM), a Programmable ROM (PROM), an Electrically Erasable and Programmable ROM (EEPROM), an Electrically Programmable ROM (EPROM), a flash memory, a Phase change RAM (PRAM), a Magnetic RAM (MRAM), a Resistive RAM (RRAM) or a Ferroelectric RAM (FRAM).

The first and second semiconductor apparatuses 110 and 120 may be coupled to each other through a signal transmission line 130. The first semiconductor apparatus 110 may include a pad 111 coupled to the signal transmission line 130. The second semiconductor apparatus 120 may include a pad 121 coupled to the signal transmission line 130. The signal transmission line 130 may be a channel, a link or a bus. The first semiconductor apparatus 110 may include a transmitter circuit (TX) 112 and a receiver circuit (RX) 113. The transmitter circuit 112 may generate an output signal according to an internal signal of the first semiconductor apparatus 110, and may transmit an output signal to the second semiconductor apparatus 120 through the signal transmission line 130. The receiver circuit 113 may receive a signal transmitted from the second semiconductor apparatus 120 through the signal transmission line 130, and may generate an internal signal. Similarly, the second semiconductor apparatus 120 may include a transmitter circuit (TX) 122 and a receiver circuit (RX) 123. The transmitter circuit 122 may generate an output signal according to an internal signal of the second semiconductor apparatus 120, and may transmit an output signal to the first semiconductor apparatus 110 through the signal transmission line 130. The receiver circuit 123 may receive a signal transmitted from the first semiconductor apparatus 110 through the signal transmission line 130, and may generate an internal signal.

The signal transmission line 130 may be a data bus. The transmitter circuit 112 of the first semiconductor apparatus 110 may transmit data signals to the second semiconductor apparatus 120, and the receiver circuit 113 of the first semiconductor apparatus 110 may receive data signals transmitted from the second semiconductor apparatus 120. The transmitter circuit 122 of the second semiconductor apparatus 120 may transmit data signals to the first semiconductor apparatus 110, and the receiver circuit 123 of the second semiconductor apparatus 120 may receive data signals transmitted from the first semiconductor apparatus 110. Data signals between the first and second semiconductor apparatuses 110 and 120 may be transmitted via a serial communication interface. For example, a single stream of the data signals may be transmitted through the signal transmission line 130. In order to increase a transmission bit rate, a serial-to-parallel conversion may be made at an interface between the first semiconductor apparatus 110 and the signal transmission line 130 and at an interface between the second semiconductor apparatus 120 and the signal transmission line 130. Each of the receiver circuits 113 and 123 may include a parallelizer for converting a serial data stream into parallel data. Each of the transmitter circuits 112 and 122 may include a serializer for converting parallel data into a serial data stream.

Figure 2:
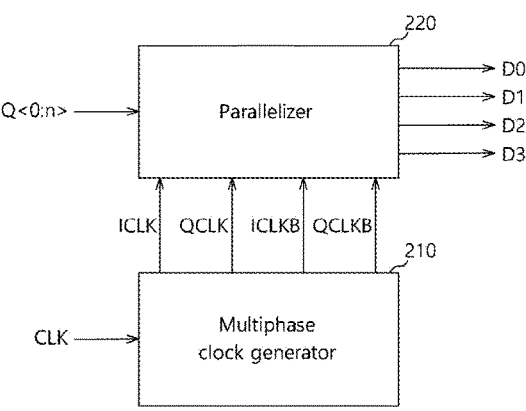
FIG. 2 is a diagram illustrating an example of a receiver circuit in accordance with an embodiment.

FIG. 2 is a diagram illustrating an example of a receiver circuit 200 in accordance with an embodiment. In FIG. 2, the receiver circuit 200 may include a multiphase clock generator 210 and a parallelizer 220. In an embodiment, the receiver circuits 113 and 123 illustrated in FIG. 1 may have the same configuration as the receiver circuit 200. The multiphase clock generator 210 may generate a plurality of multiphase clock signals (e.g. first to fourth multiphase clock signals ICLK, QCLK, ICLKB and QCLKB which have different phases from one another) based on a clock signal CLK. The clock signal CLK may be an external clock signal such as a system clock signal. The multiphase clock generator 210 may generate the multiphase clock signals ICLK, QCLK, ICLKB and QCLKB by dividing the clock signal CLK. For example, the multiphase clock signals ICLK, QCLK, ICLKB and QCLKB may be at half the frequency of the clock signal CLK. The multiphase clock generator 210 may generate four multiphase clock signals ICLK, QCLK, ICLKB and QCLKB which have a phase difference of 90 degrees from one another.

The parallelizer 220 may generate four parallel data signals D0, D1, D2 and D3 by converting a serial input data signal DQ<0:n>. The parallelizer 220 may generate the first data signal D0 by capturing a first input data signal DQ<0> based on the first multiphase clock signal ICLK. The parallelizer 220 may generate the second data signal D1 by capturing a second input data signal DQ<1> based on the second multiphase clock signal QCLK. The parallelizer 220 may generate the third data signal D2 by capturing a third input data signal DQ<2> based on the third multiphase clock signal ICLKB. The parallelizer 220 may generate the fourth data signal D3 by capturing a fourth input data signal DQ<3> based on the fourth multiphase clock signal QCLKB. Fifth to eight input data signals DQ<4:7> may be captured based on, again, the first to fourth multiphase clock signals ICLK, QCLK, ICLKB and QCLKB, respective, and the captured data signals may be generated as the first to fourth data signals D0, D1, D2 and D3, respectively. The input data signal DQ<0:n> may be synchronized with the clock signal CLK, and may have a window (e.g., pulse duration) corresponding to one half cycle of the clock signal CLK. The first to fourth data signals D0, D1, D2 and D3 may be synchronized with the first to fourth multiphase clock signals ICLK, QCLK, ICLKB and QCLKB, respectively, and may have a window (e.g., pulse duration) corresponding to one half cycle of the multiphase clock signals ICLK, QCLK, ICLKB and QCLKB. Therefore, the receiver circuit 200 may lengthen the window (e.g. pulse duration) of the first to fourth data signals D0, D1, D2 and D3.

While FIG. 2 illustrates that the parallelizer 220 converts serial data into four parallel data signals, the present disclosure is not limited thereto. The number of parallel data signals generated by the parallelizer 220 may vary. For example, the parallelizer 220 may generate eight parallel data signal by converting the input data DQ<0:n>, and the multiphase clock generator 210 may generate eight multiphase clock signals having a phase difference of 45 degrees.

Figure 3:
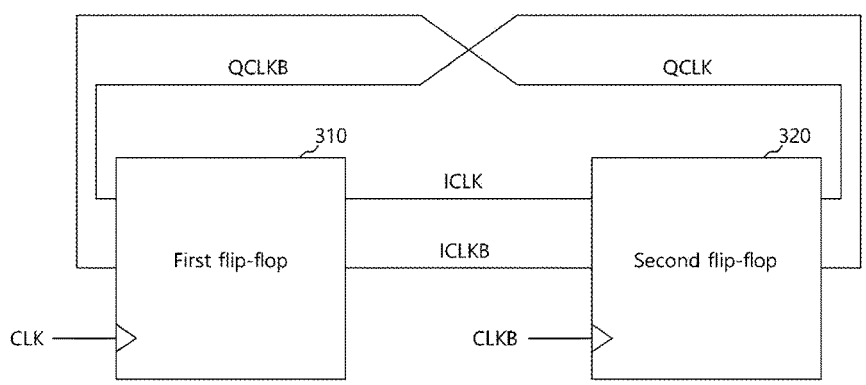
FIG. 3 is a diagram illustrating an example of a multi-phase clock generator in accordance with an embodiment.

FIG. 3 is a diagram illustrating an example of a multiphase clock generator 300 in accordance with an embodiment. In FIG. 3, the multiphase clock generator 300 may include a first flip-flop 310 and a second flip-flop 320. The first and second flip-flops 310 and 320 may receive a clock signal CLK and a complementary clock signal CLKB, respectively. The first and second flip-flops 310 and 320 may operate in synchronization with the clock signal CLK and the complementary clock signal CLKB, respectively. For example, the first flip-flop 310 may operate in synchronization with the clock signal CLK, and the second flip-flop 320 may operate in synchronization with the complementary clock signal CLKB. The first flip-flop 310 may receive second and fourth multiphase clock signals QCLK and QCLKB and output first and third multiphase clock signals ICLK and ICLKB. The first flip-flop 310 may maintain the phases of the first and third multiphase clock signals ICLK and ICLKB for one cycle of the clock signal CLK. The first flip-flop 310 may receive the fourth multiphase clock signal QCLKB as a first input signal thereof and receive the second multiphase clock signal QCLK as a second input signal thereof. The second flip-flop 320 may receive the first and third multiphase clock signals ICLK and ICLKB output from the first flip-flop 310, and may output the second and fourth multiphase clock signals QCLK and QCLKB. The second flip-flop 320 may maintain the phases of the second and fourth multiphase clock signals QCLK and QCLKB for one cycle of the complementary clock signal CLKB. The second flip-flop 320 may receive the first multiphase clock signal ICLK as a first input signal thereof and receive the third multiphase clock signal ICLKB as a second input signal thereof. The first and third multiphase clock signals ICLK and ICLKB may be a differential pair of signals having a phase difference of 180 degrees, and the second and fourth multiphase clock signals QCLK and QCLKB may be a differential pair of signals having a phase difference of 180 degrees. Also, the phase of the first multiphase clock signal ICLK may lead the phase of the second multiphase clock signal QCLK by 90 degrees. Since the multiphase clock generator 300 is constructed by a flip-flop chain structure in which flip-flops receive the outputs of each other, it is possible to continuously generate the first to fourth multiphase clock signals ICLK, QCLK, ICLKB and QCLKB toggling at half the frequency of the clock signal CLK.

Figure 4:
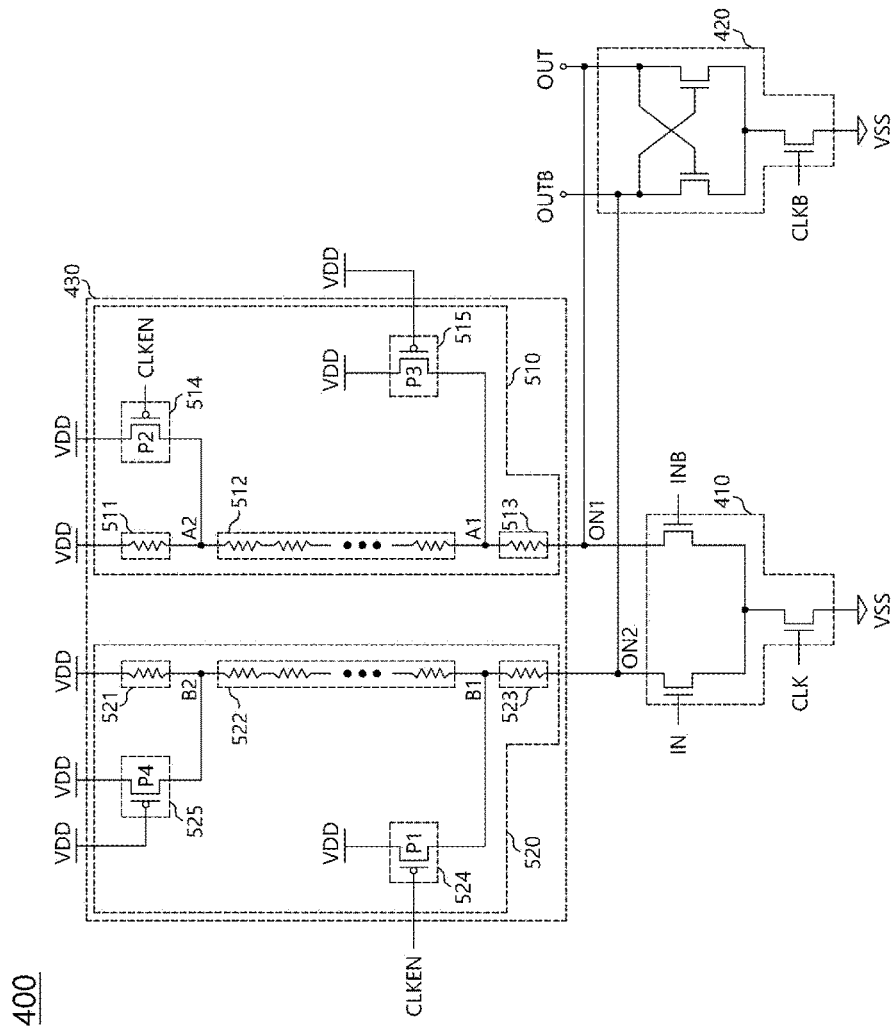
FIG. 4 is a diagram illustrating an example of a buffer in accordance with an embodiment.

FIG. 4 is a diagram illustrating an example of a buffer 400 in accordance with an embodiment. The buffer 400 may be a part of one or both of the first and second flip-flops 310 and 320 illustrated in FIG. 3. In an embodiment, one or both of the first and second flip-flops 310 and 320 illustrated in FIG. 3 may have the same configuration as the buffer 400. In FIG. 4, the buffer 400 may receive a pair of input signals, and generate a pair of output signals by amplifying the pair of input signals based on a clock signal CLK. In a case where the buffer 400 is the second flip-flop 320, the buffer 400 may receive a complementary clock signal CLKB instead of the clock signal CLK. The pair of input signals may be a first input signal IN and a second input signal INB, and the pair of output signals may be a first output signal OUT and a second output signal OUTB. If the buffer 400 is the first flip-flop 310, the first input signal IN may be the fourth multiphase clock signal QCLKB, and the second input signal INB may be the second multiphase clock signal QCLK. The first output signal OUT may be the first multiphase clock signal ICLK, and the second output signal OUTB may be the third multiphase clock signal ICLKB.

The buffer 400 may include an amplification circuit 410, a latch circuit 420, and an amplification current generation circuit 430. The amplification circuit 410 may change the voltage levels of a first output node ON1 and a second output node ON2 based on the clock signal CLK and the pair of input signals IN and INB. The amplification circuit 410 may change the voltage levels of the first output node ON1 and the second output node ON2 based on the pair of input signals IN and INB when the clock signal CLK is at a first level. The first level may be, for example, a logic high level. The latch circuit 420 may latch the voltage levels of the first and second output nodes ON1 and ON2 based on the clock signal CLK, and may generate the pair of output signals OUT and OUTB. The latch circuit 420 may be any type of logic circuit that is used to store state information. For example, the latch circuit 420 may be a latch-type amplification circuit. The latch circuit 420 may latch the voltage levels of the first and second output nodes ON1 and ON2 when the clock signal CLK is at a second level. The second level may be, for example, a logic low level.

The amplification current generation circuit 430 may provide amplification currents to the first and second output nodes ON1 and ON2. The amplification current generation circuit 430 may change the currents to be provided to the first and second output nodes ON1 and ON2 depending on the operation period of the buffer 400. The buffer 400 may operate in a first operation period and a second operation period. The first and second operation periods may be determined based on the clock signal CLK. The first operation period may be an initial operation period in which the clock signal CLK is not input to the buffer 400. The second operation period may be a normal operation period when or after the clock signal CLK is input to the buffer 400. The amplification current generation circuit 430 may provide currents of different magnitudes to the first and second output nodes ON1 and ON2 during the first operation period. By providing currents of different magnitudes to the first and second output nodes ON1 and ON2 during the first operation period, the amplification current generation circuit 430 may change the voltage levels of the first and second output nodes ON1 and ON2 differently from each other regardless the pair of input signals IN and INB. For example, during the first operation period, the current provided to the first output node ON1 by the amplification current generation circuit 430 may be smaller than the current provided to the second output node ON2. The amplification current generation circuit 430 may provide currents of the same magnitude to the first and second output nodes ON1 and ON2 during the second operation period.

If the buffer 400 is the multiphase clock generator 300 illustrated in FIG. 3, the buffer 400 may be in a metastable state at an initial operation stage. At the initial operation stage of the multiphase clock generator 300, the phases and logic levels of the first to fourth multiphase clock signals ICLK, QCLK, ICLKB and QCLKB may not be distinguishable. For example, the first and third multiphase clock signals ICLK and ICLKB may have the same voltage level as one another, and the second and fourth multiphase clock signals QCLK and QCLKB may have the same voltage level as one another. Therefore, the first and second flip-flops 310 and 320 may not precisely amplify the first to fourth multiphase clock signals ICLK, QCLK, ICLKB and QCLKB, and the output signals of the first and second flip-flops 310 may be somewhere in between a logic high level and a logic low level, for several cycles of the clock signal CLK. In order to prevent output signals from being generated in the metastable state, the buffer 400 in accordance with an embodiment may change the voltage levels of the first and second output nodes ON1 and ON2 regardless of the pair of input signals IN and INB during the initial operation period of the buffer 400, and thus the logic levels of the pair of output signals OUT and OUTB may settle down to either the logic high level or the logic low level in the next operations of the buffer 400 performed based on the clock signal CLK.

In FIG. 4, the amplification current generation circuit 430 may include a first load circuit 510 and a second load circuit 520. The first load circuit 510 may provide a first current to the first output node ON1 during the first operation period, and the second load circuit 520 may provide a second current to the second output node ON2 during the first operation period. The magnitude of the first current may be smaller than the magnitude of the second current. The first and second load circuits 510 and 520 may provide the same magnitude of currents to the first and second output nodes ON1 and ON2 during the second operation period.

The first load circuit 510 may include a first load resistor 511, a second load resistor 512, and a third load resistor 513, which are coupled in series between a power supply voltage VDD and the first output node ON1. The second load circuit 520 may include a fourth load resistor 521, a fifth load resistor 522, a sixth load resistor 523, and a first offset switch 524, which are coupled in series between the power supply voltage VDD and the second output node ON2. The fourth load resistor 521 may have a resistance value corresponding to the first load resistor 511. Likewise, the fifth load resistor 522 may have a resistance value corresponding to the second load resistor 512, and the sixth load resistor 523 may have a resistance value corresponding to the third load resistor 513. In FIG. 4, each of the first load resistor 511, the third load resistor 513, the fourth load resistor 521, and the sixth load resistor 523 may include one resistor element, and each of the second load resistor 512 and the fifth load resistor 522 may include a plurality of resistor elements. However, it is to be noted that the number of resistor elements included in each load resistor is not limited thereto.

The first offset switch 524 may provide the power supply voltage VDD to a node B1 between the fifth load resistor 522 and the sixth load resistor 523 based on the clock signal CLK. The first offset switch 524 may provide the power supply voltage VDD to the node B1 between the fifth load resistor 522 and the sixth load resistor 523 during the first operation period. The first offset switch 524 may be turned off during the second operation period. The first offset switch 524 may include a first PMOS transistor P1. The first PMOS transistor P1 may have a gate receiving an operation control signal CLKEN, a source receiving the power supply voltage VDD, and a drain coupled to the node B1 between the fifth load resistor 522 and the sixth load resistor 523. The operation control signal CLKEN may be a signal for distinguishing the first operation period and the second operation period, and may stay in an enabled state when the clock signal CLK is not input. For example, the first operation period may be a period in which the clock signal CLK does not toggle, and the second operation period may be a period in which the clock signal CLK toggles. Referring to FIG. 5, the operation control signal CLKEN may be disabled when or after the clock signal CLK is input. The operation control signal CLKEN may be enabled to a low level and be disabled to a high level. Further, a complementary operation control signal CLKBEN may stay in an enabled state when the complementary clock signal CLKB is not input, and may be disabled when or after the complementary clock signal CLKB is input. Points in time when the operation control signals CLKEN and CLKBEN are disabled may be after the clock signal CLK and the complementary clock signal CLKB are input, and may be changed according to an application. The complementary operation control signal CLKBENB may be an inverted signal of the operation control signal CLKBEN. Points in time when the operation control signals CLKEN, CLKBEN and CLKBENB become disabled may vary.

In FIG. 4, the first load circuit 510 may further include a second offset switch 514. The second offset switch 514 may provide the power supply voltage VDD to a node A2 between the first load resistor 511 and the second load resistor 512 during the first operation period. The second offset switch 514 may be turned off during the second operation period. The second offset switch 514 may include a second PMOS transistor P2. The second PMOS transistor P2 may have a gate receiving the operation control signal CLKEN, a source receiving the power supply voltage VDD, and a drain coupled to the node A2 between the first load resistor 511 and the second load resistor 512.

If the operation control signal CLKEN is enabled, the first and second offset switches 524 and 514 may be turned on. In the first load circuit 510, a current may be provided to the first output node ON1 through a path extending from the power supply voltage VDD through the second offset switch 514, the second load resistor 512 and the third load resistor 513. In the second load circuit 520, a current may be provided to the second output node ON2 through a path extending from the power supply voltage VDD through the first offset switch 524 and the sixth load resistor 523. Since the resistance value of the current path formed in the second load circuit 520 is smaller than the resistance value of the current path formed in the first load circuit 510, a larger amount of current may be provided to the second output node ON2 than the first output node ON1. Accordingly, the voltage level of the second output node ON2 may become higher than the voltage level of the first output node ON1. If the operation control signal CLKEN is disabled, the first and second offset switches 524 and 514 may be turned off. Accordingly, in the first load circuit 510, a current may be provided to the first output node ON1 through a path extending from the power supply voltage VDD through the first load resistor 511, the second load resistor 512, and the third load resistor 513. In the second load circuit 520, a current may be provided to the second output node ON2 through a path extending from the power supply voltage VDD through the fourth load resistor 521, the fifth load resistor 522, and the sixth load resistor 523. Since the fourth to sixth load resistors 521, 522, and 523 have resistance values corresponding to the first to third load resistors 511, 512, and 513, respectively, the same magnitude of currents may be provided to the first and second output nodes ON1 and ON2 by the first and second load circuits 510 and 520.

In FIG. 4, the first load circuit 510 may further include a first dummy switch 515. The first dummy switch 515 may be provided to compensate for a loading increase due to the first offset switch 524 of the second load circuit 520 and to thereby make an electrical load of the first load circuit 510 match an electrical load of the second load circuit 520. The first dummy switch 515 may receive the power supply voltage VDD, and may be coupled to a node A1 between the second load resistor 512 and the third load resistor 513. The first dummy switch 515 may include a third PMOS transistor P3. The third PMOS transistor P3 may have a gate receiving the power supply voltage VDD, a source receiving the power supply voltage VDD, and a drain coupled to the node A1 between the second load resistor 512 and the third load resistor 513. Since the third PMOS transistor P3 receives the power supply voltage VDD through the gate thereof, the third PMOS transistor P3 may stay in a turned-off state.

The second load circuit 520 may further include a second dummy switch 525. The second dummy switch 525 may be provided to compensate for a loading increase due to the second offset switch 514 of the first load circuit 510 and to thereby make an electrical load of the second load circuit 520 match an electrical load of the first load circuit 510. The second dummy switch 525 may receive the power supply voltage VDD, and may be coupled to a node B2 between the fourth load resistor 521 and the fifth load resistor 522. The second dummy switch 525 may include a fourth PMOS transistor P4. The fourth PMOS transistor P4 may have a gate receiving the power supply voltage VDD, a source receiving the power supply voltage VDD, and a drain coupled to the node B2 between the fourth load resistor 521 and the fifth load resistor 522. Since the fourth PMOS transistor P4 receives the power supply voltage VDD through the gate thereof, the fourth PMOS transistor P4 may stay in a turned-off state.

FIG. 5 is a timing diagram illustrating example waveforms of the buffer 400 and the multiphase clock generator 300 of FIG. 3 in accordance with an embodiment. Example operations of the buffer 400 and the multiphase clock generator 300 in accordance with an embodiment will be described below with reference to FIGS. 3 to 5. If the first flip-flop 310 is the buffer 400 illustrated in FIG. 4, the first input signal IN may be the fourth multiphase clock signal QCLKB, and the second input signal INB may be the second multiphase clock signal QCLK. The first output signal OUT may be the first multiphase clock signal ICLK, and the second output signal OUTB may be the third multiphase clock signal ICLKB. If the second flip-flop 320 is the buffer 400, the first input signal IN may be the first multiphase clock signal ICLK, and the second input signal INB may be the third multiphase clock signal ICLKB. The first output signal OUT may be the second multiphase clock signal QCLK, and the second output signal OUTB may be the fourth multiphase clock signal QCLKB. In the first operation period, the clock signal CLK and the complementary clock signal CLKB may not be input, and may be at low levels. Therefore, the operation control signal CLKEN may maintain the enabled state. When the operation control signal CLKEN is in the enabled state, the first flip-flop 310 may change a voltage level of an output node of the first multiphase clock signal ICLK to a low level, and may change a voltage level of an output node of the third multiphase clock signal ICLKB to a high level. The second flip-flop 320 may change a voltage level of an output node of the second multiphase clock signal QCLK to a low level, and may change a voltage level of an output node of the fourth multiphase clock signal QCLKB to a high level.

In the second operation period, if the clock signal CLK is input, the operation control signal CLKEN may be disabled. Accordingly, the first and second flip-flops 310 and 320 may perform general amplification and latching operations. The first flip-flop 310 may receive the fourth multiphase clock signal QCLKB having the high level, as a first input signal, and may receive the second multiphase clock signal QCLK having the low level, as a second input signal. The first flip-flop 310 may output the first multiphase clock signal ICLK having the high level, as a first output signal, and may output the third multiphase clock signal ICLKB having the low level, as a second output signal, in synchronization with the rising edge of the clock signal CLK. The second flip-flop 320 may receive the first multiphase clock signal ICLK output from the first flip-flop 310, as a first input signal, and may receive the third multiphase clock signal ICLKB, as a second input signal, in synchronization with the rising edge of the complementary clock signal CLKB. Since the first multiphase clock signal ICLK is at the high level and the third multiphase clock signal ICLKB is at the low level, the second flip-flop 320 may output the second multiphase clock signal QCLK having the high level and the fourth multiphase clock signal QCLKB having the low level.

FIG. 6 is a timing diagram illustrating example waveforms of the multiphase clock generator 300 in accordance with an embodiment and waveforms of the conventional art. Referring to FIG. 6, during the initial operation period in which the clock signal CLK and the complementary clock signal CLKB are not input, the voltage levels of the first to fourth multiphase clock signals ICLK, QCLK, ICLKB and QCLKB may not be distinguishable. For example, all the first to fourth multiphase clock signals ICLK, QCLK, ICLKB and QCLKB may be at high levels. Accordingly, like the waveforms of the conventional art, even if a multiphase clock generator operates in response to the clock signal CLK, multiphase clock signals output from the multiphase clock generator may be in metastable states during a predetermined period at an initial operation stage.

In the buffer 400 in accordance with an embodiment, before the clock signal CLK is input, the first output signal OUT may be at the low level and the second output signal OUTB may be at the high level. The multiphase clock generator 300 may be set such that the first to fourth multiphase clock signals ICLK, QCLK, ICLKB and QCLKB have specific levels when the clock signal CLK is not input. Therefore, the multiphase clock generator 300 may generate multiphase clock signals that can settle into either a stable logic high level or a stable logic low level even in the initial operation period, and may normally generate the first to fourth multiphase clock signals ICLK, QCLK, ICLKB and QCLKB without experiencing metastability.

FIG. 7 is a diagram illustrating an example of a buffer 700 in accordance with an embodiment. In an embodiment, each of the first flip-flop 310 and the second flip-flop 320 illustrated in FIG. 3 may have the same configuration as the buffer 700 of FIG. 7. In FIG. 7, the buffer 700 may include an amplification circuit 710, a latch circuit 720, and an amplification current generation circuit 730. The amplification circuit 710 may receive a clock signal CLK, a first input signal IN and a second input signal INB, and may change the voltage levels of a first intermediate output node LAT and a second intermediate output node LATB based on the clock signal CLK and the pair of input signals IN and INB. The latch circuit 720 may be coupled to the first and second intermediate output nodes LAT and LATB and generate first and second output signals OUT and OUTB. The latch circuit 720 may generate the first and second output signals OUT and OUTB by latching the voltage levels of the first and second intermediate output nodes LAT and LATB. The latch circuit 720 may be a general latch circuit such as an SR latch circuit.

The amplification current generation circuit 730 may change the voltage levels of the first and second intermediate output nodes LAT and LATB based on the first and second input signals IN and INB. The amplification current generation circuit 730 may change the voltage levels of the first and second intermediate output nodes LAT and LATB to different levels, regardless of the first and second input signals IN and INB, when the clock signal CLK is not input to the buffer 700. The amplification current generation circuit 730 may include a cross-coupled latch 731 and an offset switch 732. The cross-coupled latch 731 may latch the voltage levels of the first and second intermediate output nodes LAT and LATB.

The offset switch 732 may receive an operation control signal CLKBENB, and may be coupled between the first intermediate output node LAT and a ground voltage node VSS. The offset switch 732 may discharge the first intermediate output node LAT to the ground voltage VSS in response to the operation control signal CLKBENB. Accordingly, if the offset switch 732 is turned on, the first intermediate output node LAT may become a low level. The first offset switch 732 may include a first NMOS transistor N1. The first NMOS transistor N1 may have a gate receiving the operation control signal CLKBENB, a drain coupled to the first intermediate output node LAT, and a source coupled to the ground voltage VSS.

In FIG. 7, the amplification current generation circuit 730 may further include a dummy switch 733 and a precharge circuit 734. The dummy switch 733 may be provided to compensate for a loading mismatch that may occur as the offset switch 732 is coupled between the first intermediate output node LAT and the ground voltage VSS. The dummy switch 733 may be coupled between the second intermediate output node LATB and the ground voltage VSS. The dummy switch 733 may stay turned off. The dummy switch 733 may include a second NMOS transistor N2. The second NMOS transistor N2 may have a gate receiving the ground voltage VSS, a drain coupled to the second intermediate output node LATB, and a source coupled to the ground voltage VSS.

The precharge circuit 734 may precharge the first and second intermediate output nodes LAT and LATB based on the clock signal CLK. The precharge circuit 734 may include a third NMOS transistor N3 and a fourth NMOS transistor N4. The third NMOS transistor N3 may have a gate receiving a complementary clock signal CLKB, a drain coupled to the first intermediate output node LAT, and a source coupled to the ground voltage VSS. The fourth NMOS transistor N4 may have a gate receiving the complementary clock signal CLKB, a drain coupled to the second intermediate output node LATB, and a source coupled to the ground voltage VSS. Therefore, the third and fourth NMOS transistors N3 and N4 may precharge the first and second intermediate output nodes LAT and LATB to the low level when the complementary clock signal CLKB is at a high level.

When the operation control signal CLKBENB is in an enabled state as the clock signal CLK is not input, the offset switch 732 may be turned on and discharge the first intermediate output node LAT to the low level. Since the second intermediate output node LATB may have a voltage level relatively higher than the first intermediate output node LAT, the second intermediate output node LATB may become a high level. Thereafter, if the clock signal CLK is input, the operation control signal CLKBENB may be disabled, and the buffer 700 may change the voltage levels of the first and second intermediate output nodes LAT and LATB based on the first and second input signals IN and INB. Accordingly, if the clock signal CLK is input, the buffer 700 may generate stable first and second output signals OUT and OUTB. The multiphase clock generator 300 including the buffer 700 may be set such that the levels of the first to fourth multiphase clock signals ICLK, QCLK, ICLKB and QCLKB have specific levels during the initial operation period, and may operate normally without experiencing metastability.

While various embodiments have been described above, it will be understood to those skilled in the art that the embodiments described are examples only. Accordingly, the buffer, and the multiphase clock generator, the semiconductor apparatus and the system using the same described herein should not be limited based on the described embodiments.

What is claimed is:

1. A buffer comprising:
  an amplification circuit configured to change voltage levels of a first output node and a second output node based on a clock signal and a pair of input signals;
  an amplification current generation circuit configured to provide currents having different magnitudes to the first and second output nodes during a first operation period, the amplification current generation circuit providing currents having the same magnitude to the first and second output nodes during a second operation period; and
  a latch circuit configured to latch the voltage levels of the first output node and the second output node based on the clock signal.

2. The buffer according to claim 1, wherein, during the first operation period, the current provided to the first output node is smaller than the current provided to the second output node.

3. The buffer according to claim 1, wherein the first operation period includes a period in which the clock signal does not toggle, and the second operation period includes a period in which the clock signal toggles.

4. The buffer according to claim 1, wherein the amplification current generation circuit comprises:
  a first load circuit configured to provide a first current to the first output node during the first operation period; and
  a second load circuit configured to provide a second current larger than the first current to the second output node during the first operation period, and
  wherein the first and second load circuits provide the same magnitude of currents to the first and second output nodes, respectively, during the second operation period.

5. The buffer according to claim 1, wherein, when the clock signal has a first level, the amplification circuit changes the voltage levels of the first and second output nodes based on the pair of input signals, and, when the clock signal has a second level, the latch circuit latches the voltage levels of the first and second output nodes and generates a pair of output signals.

6. The buffer according to claim 5, wherein the first load circuit comprises a first load resistor, a second load resistor and a third load resistor coupled in series between a power supply voltage and the first output node, and
  wherein the second load circuit comprises:
  a fourth load resistor, a fifth load resistor and a sixth load resistor coupled in series between the power supply voltage and the second output node, the fourth through sixth load resistors having resistance values substantially the same as the first through third load resistors, respectively; and
  a first offset switch configured to provide the power supply voltage to a node between the fifth load resistor and the sixth load resistor when an operation control signal is in an enabled state, the first offset switch being turned off when the operation control signal is in a disabled state.

7. The buffer according to claim 6, wherein the first load circuit further comprises a second offset switch configured to provide the power supply voltage to a node between the first load resistor and the second load resistor when the operation control signal is in the enabled state, the second offset switch being turned off when the operation control signal is in the disabled state.

8. The buffer according to claim 7, wherein the first load circuit further comprises a first dummy switch coupled to the power supply voltage and a node between the second load resistor and the third load resistor.

9. The buffer according to claim 8, wherein the second load circuit further comprises a second dummy switch coupled to the power supply voltage and a node between the fourth load resistor and the fifth load resistor.

10. The buffer according to claim 6, wherein the operation control signal maintains the enabled state when the clock signal is not input to the buffer, the operation control signal becoming disabled when or after the clock signal is input.

11. A buffer comprising:
a first amplification circuit configured to change voltage levels of a first output node and a second output node based on a clock signal and a pair of input signals;
a first load resistor, a second load resistor and a third load resistor coupled in series between a power supply voltage and the first output node;
a fourth load resistor, a fifth load resistor and a sixth load resistor coupled in series between the power supply voltage and the second output node;
a first offset switch configured to provide the power supply voltage to a node between the fifth load resistor and the sixth load resistor based on the clock signal; and
a second amplification circuit configured to store the voltage levels of the first output node and the second output node based on the clock signal.

12. The buffer according to claim 11, wherein, when the clock signal has a first level, the first amplification circuit changes the voltage levels of the first and second output nodes based on the pair of input signals, and, when the clock signal has a second level, the second amplification circuit latches the voltage levels of the first and second output nodes and generates a pair of output signals.

13. The buffer according to claim 11, wherein the first offset switch provides the power supply voltage to the node between the fifth load resistor and the sixth load resistor when the clock signal is not input to the buffer, the first offset switch becoming turned off when or after the clock signal is input.

14. The buffer according to claim 11, further comprising a second offset switch configured to provide the power supply voltage to a node between the first load resistor and the second load resistor based on the clock signal.

15. The buffer according to claim 14, further comprising a second dummy switch coupled to the power supply voltage and a node between the fourth load resistor and the fifth load resistor.

16. The buffer according to claim 11, further comprising a first dummy switch coupled to the power supply voltage and a node between the second load resistor and the third load resistor.

17. A buffer comprising:
an amplification circuit configured to change voltage levels of a first output node and a second output node based on a clock signal and a pair of input signals;
an amplification current generation circuit configured to change, when the clock signal is not input, the first and second output nodes to different voltage levels regardless of the pair of input signals; and
a latch circuit configured to latch the voltage levels of the first output node and the second output node based on the clock signal, the latch circuit generating a pair of output signals.

18. The buffer according to claim 17, wherein the amplification current generation circuit provides the same magnitude of currents to the first and second output nodes when or after the clock signal is input.

19. The buffer according to claim 18, wherein, when the clock signal has a first level, the amplification circuit changes the voltage levels of the first and second output nodes based on the pair of input signals, and, when the clock signal has a second level, the latch circuit latches the voltage levels of the first and second output nodes and generates the pair of output signals.

20. The buffer according to claim 18, wherein the amplification current generation circuit comprises:
a first load resistor, a second load resistor and a third load resistor coupled in series between a power supply voltage and the first output node;
a fourth load resistor, a fifth load resistor and a sixth load resistor coupled in series between the power supply voltage and the second output node;
a first offset switch configured to provide the power supply voltage to a node between the fifth load resistor and the sixth load resistor based on an operation control signal; and
a second offset switch configured to provide the power supply voltage to a node between the first load resistor and the second load resistor based on the operation control signal.

* * * * *